(12) United States Patent
Barnes et al.

(10) Patent No.: US 10,886,697 B2
(45) Date of Patent: Jan. 5, 2021

(54) PULSED LASER DIODE DRIVER

(71) Applicant: Analog Devices, Inc., Norwood, MA (US)

(72) Inventors: Erik D. Barnes, Cambridge, MA (US); Lawrence A. Singer, Bedford, MA (US); Harvey Weinberg, Sharon, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/219,754

(22) Filed: Dec. 13, 2018

(65) Prior Publication Data

US 2019/0386460 A1 Dec. 19, 2019

Related U.S. Application Data

(63) Continuation of application No. 15/244,532, filed on Aug. 23, 2016, now Pat. No. 10,158,211.

(60) Provisional application No. 62/351,651, filed on Jun. 17, 2016, provisional application No. 62/221,708, filed on Sep. 22, 2015.

(51) Int. Cl.
*H01S 5/042* (2006.01)
*H01S 3/10* (2006.01)
*H01S 5/026* (2006.01)
*H01S 5/06* (2006.01)
*H01S 5/068* (2006.01)
*H01S 5/40* (2006.01)

(52) U.S. Cl.
CPC .............. *H01S 5/0428* (2013.01); *H01S 3/10* (2013.01); *H01S 5/0261* (2013.01); *H01S 5/0608* (2013.01); *H01S 5/06808* (2013.01); *H01S 5/4025* (2013.01)

(58) Field of Classification Search
CPC ........ H01S 5/0428; H01S 3/10; H01S 5/0608; H01S 5/06808; H01S 5/0261; H01S 5/4025
See application file for complete search history.

(56) References Cited

U.S. PATENT DOCUMENTS

| | | | | |
|---|---|---|---|---|
| 3,944,854 A | * | 3/1976 | Keller | H05B 33/0818 327/514 |
| 5,287,372 A | * | 2/1994 | Ortiz | H01S 5/042 372/25 |
| 5,430,749 A | * | 7/1995 | Horie | H01S 5/042 372/38.02 |
| 5,736,881 A | * | 4/1998 | Ortiz | H01S 5/042 323/269 |

(Continued)

*Primary Examiner* — Yuanda Zhang
(74) *Attorney, Agent, or Firm* — Patent Capital Group

(57) ABSTRACT

Optical systems can emit train(s) of light pulses onto objects to derive a distance between the light source and the object. Achieving meter or centimeter resolution may require very short light pulses. It is not trivial to design a circuit that can generate narrow current pulses for driving a diode that emits the light pulses. An improved driver circuit has a pre-charge path comprising one or more inductive elements and a fire path comprising the diode. Switches in the driver circuit are controlled with predefined states during different intervals to pre-charge current in the one or more inductive elements prior to flowing current through the fire path to pulse the diode.

20 Claims, 17 Drawing Sheets

(56) References Cited

U.S. PATENT DOCUMENTS

| | | | |
|---|---|---|---|
| 7,227,118 B2* | 6/2007 | Suzunaga | H05B 33/0803 250/205 |
| 2003/0016711 A1* | 1/2003 | Crawford | H01S 5/042 372/38.02 |
| 2003/0039280 A1* | 2/2003 | Mangano | H01S 5/0428 372/38.02 |
| 2004/0160996 A1* | 8/2004 | Giorgi | H01S 5/042 372/25 |
| 2005/0185428 A1* | 8/2005 | Crawford | H05B 33/0818 363/21.06 |
| 2008/0258695 A1* | 10/2008 | Kumar | H05B 45/37 323/223 |
| 2010/0283322 A1* | 11/2010 | Wibben | H02M 3/158 307/31 |
| 2011/0085576 A1* | 4/2011 | Crawford | H05B 33/0818 372/38.07 |
| 2014/0211192 A1* | 7/2014 | Grootjans | H05B 33/0818 356/5.01 |
| 2016/0191196 A1* | 6/2016 | Troiani | H04B 10/502 398/52 |
| 2016/0308330 A1* | 10/2016 | Liffran | H01S 5/0428 |

\* cited by examiner

PULSED LASER DIODE DRIVER

PRIORITY DATA

This non-provisional patent application is a continuation application of non-provisional application (Ser. No. 15/244,532, filed on Aug. 23, 2016) entitled "PULSED LASER DIODE DRIVER", which claims priority to and/or receive benefit from provisional application (Ser. No. 62/221,708, filed on Sep. 22, 2015) entitled "PULSED LASER DIODE DRIVER" and provisional application (Ser. No. 62/351,651, filed on Jun. 17, 2016) entitled "PULSED LASER DIODE DRIVER". All three applications are hereby incorporated by reference in their entirety.

TECHNICAL FIELD OF THE DISCLOSURE

The present disclosure relates to the field of integrated circuits, in particular to circuits for driving laser diodes.

BACKGROUND

Optical systems come in many flavors. Optical communications pulses diodes to transmit information; optical systems such as LIDAR, time-of-flight cameras and range finders, can pulse diodes and measure reflected light to sense the presence, distance information, depth information, and/or speed information of an object. These optical systems can be used in security systems, medical systems, automotive systems, aerospace systems, etc.

Diodes are used often as a light source for many optical applications. Laser diodes are used often due to their ability to generate a great deal of light, though it is not necessary for all applications, and the choice of the light source may naturally depend on the application. Other diodes (e.g., light-emitting diodes) or electrically-driven light sources can be used.

Diodes can emit light as a function the current conducting through the diode. To implement an optical application, a driver is provided to drive the diode, i.e., provide that current to the diode, so that light can be emitted. Diode drivers can vary depending on the requirements of the application, system design, and constraints imposed by the circuit providing the diodes.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Brief Overview

Optical systems can emit train(s) of light pulses onto objects to derive a distance between the light source and the object. Achieving meter or centimeter resolution may require very short light pulses. It is not trivial to design a circuit that can generate narrow current pulses for driving a diode that emits the light pulses. An improved driver circuit has a pre-charge path comprising one or more inductive elements and a fire path comprising the diode. Switches in the driver circuit are controlled with predefined states during different intervals to pre-charge current in the one or more inductive elements prior to flowing current through the fire path to pulse the diode.

Challenges to Pulsing Laser Diodes

Optical systems such as LIDAR, time-of-flight cameras, and range finders, typically emit one or more trains of light pulses (e.g., modulated light source) onto one or more objects, and the arrival time of the reflected light is recorded. Based on arrival time and the speed of light, it is possible to derive the distance between the light source and the object.

Typically, a diode is driven with narrow and high current pulses to emit a train of light pulses onto the object (which can be meters away). The speed of light is very fast, therefore very short light pulses are needed to achieve meter or centimeter resolution. Accordingly, a train of narrow current pulses is needed to drive the diode to generate the train of short light pulses. In some cases, the desired pulse width can be less than 5 nanoseconds, with greater than 40 Amps of peak current, necessitating more than 20 Amps per nanosecond of di/dt during the pulse rise and fall times. With such stringent requirements, it is not trivial to design a circuit which can generate the narrow current pulses for driving the diode.

Figure 1A:
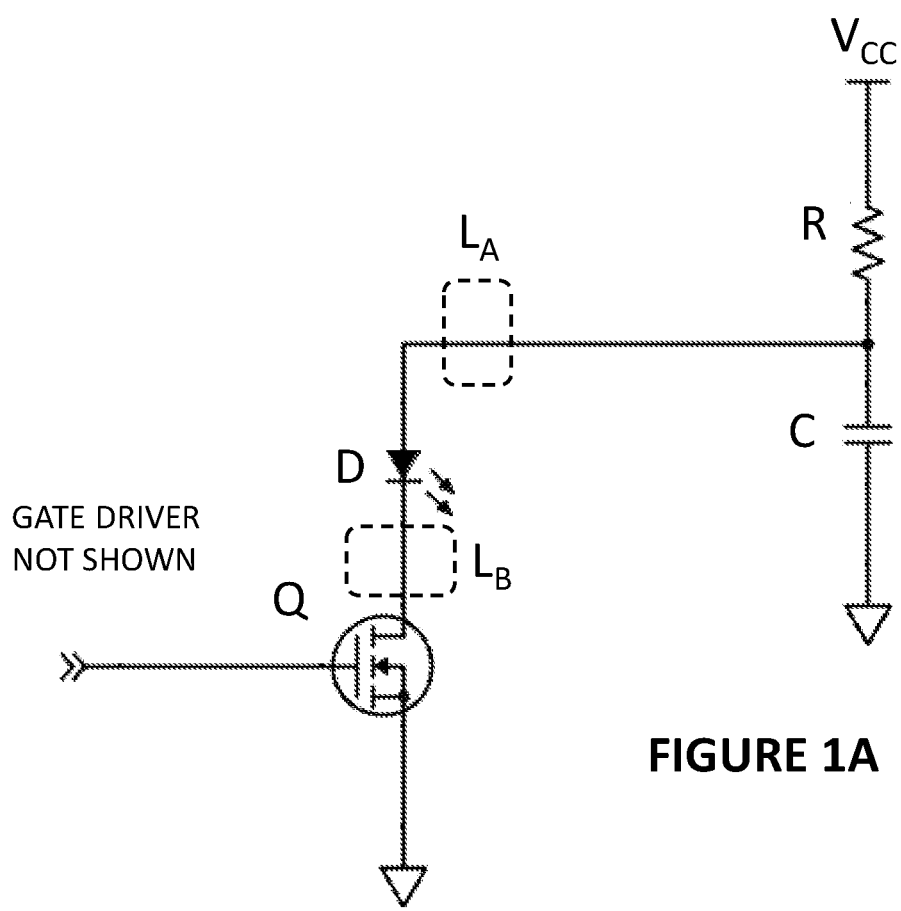
FIGS. 1A-B show examples of pulsed laser diode driver and diode.
Figure 1B:
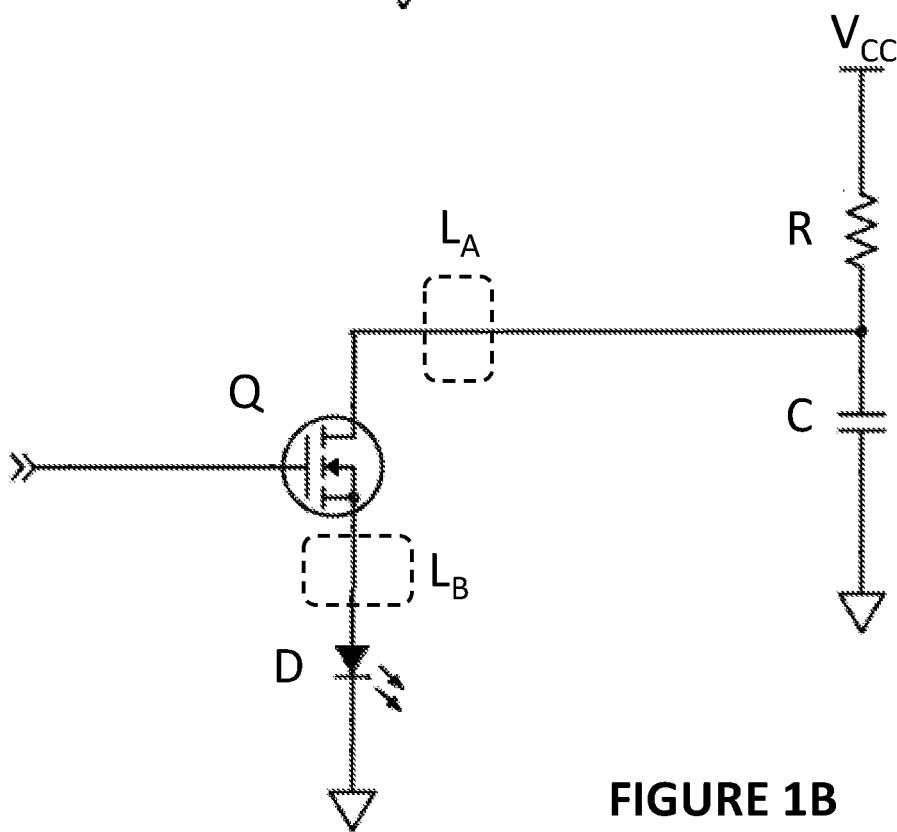

FIGS. 1A-B show examples of pulsed laser diode driver and diode, in different configurations but providing substantially equivalent functions. During a first interval, a capacitor C charges and accumulates pulse charge, while the transistor Q (acting as a switch) is OFF so that no current is conducting through the diode D and the transistor Q. During a second interval, the transistor Q switches ON to allow the charge to flow from the capacitor C through laser diode D to emit a short light pulse. As explained earlier, narrow and high current pulses are needed, in some cases di/dt (change in current over change in time, or rate of current change) needs to be equal to or greater than 10 or 20 Amps per nanoseconds. During the second interval, di/dt can be limited by how quickly the transistor Q turns on, and by how quickly current can flow through the circuit path from capacitor C towards the diode D.

Typically, discrete level shift and gate driver integrated circuits are needed to drive transistor Q. Generally speaking, how quickly (gate-driven) transistor Q turns on (i.e., FET turn on time) is impeded by the total gate charge and Miller capacitance of the transistor Q. One technique for turning on transistor Q quickly, is to provide a gate driver which can provide a high amount of charging current to more quickly charge the gate capacitance. Consider the transistor Q having a Miller capacitance of 5 picoFarad, turning on transistor Q within 4 nanoseconds may require more than an Amp of charging current. Such a gate driver circuit can increase system capacity, system costs, and system complexity. Another technique is to use power metal-oxide semiconductor field-effect transistors (MOSFETs), Galium Nitride field-effect transistor (GaNFET), or avalanche transistors, which have short rise times and high peak currents. However, these types of transistors can be costly and further adds complexity (such as very high supply voltages) to the driver circuit.

Besides the challenge of turning on transistor Q quickly, inductance $L_A$ (e.g., inductance between laser diode D anode and capacitor C of FIG. 1A, inductance between drain of transistor Q and capacitor C of FIG. 1B) and inductance $L_B$ (e.g., inductance between laser diode D cathode and drain of transistor Q of FIG. 1A, inductance between source of transistor Q and laser diode D anode of FIG. 1B) limits how fast the current will flow to turn on the diode D because these inductances will cause current from capacitor C to lag. These inductances are present due to the inevitable presence of bondwires and/or conductors connecting these circuit components. Because the required current is so high, any small inductance can limit how fast the current can go through the diode. One technique to address this issue is through advanced packaging techniques, which could potentially reduce the inductance enough to make the circuit operate faster, but these techniques suffer higher cost and assembly complexity. Furthermore, these inductances can never be made to be zero, even with advanced packaging techniques.

Improved Pulsed Laser Diode Driver Circuit

Figure 2:
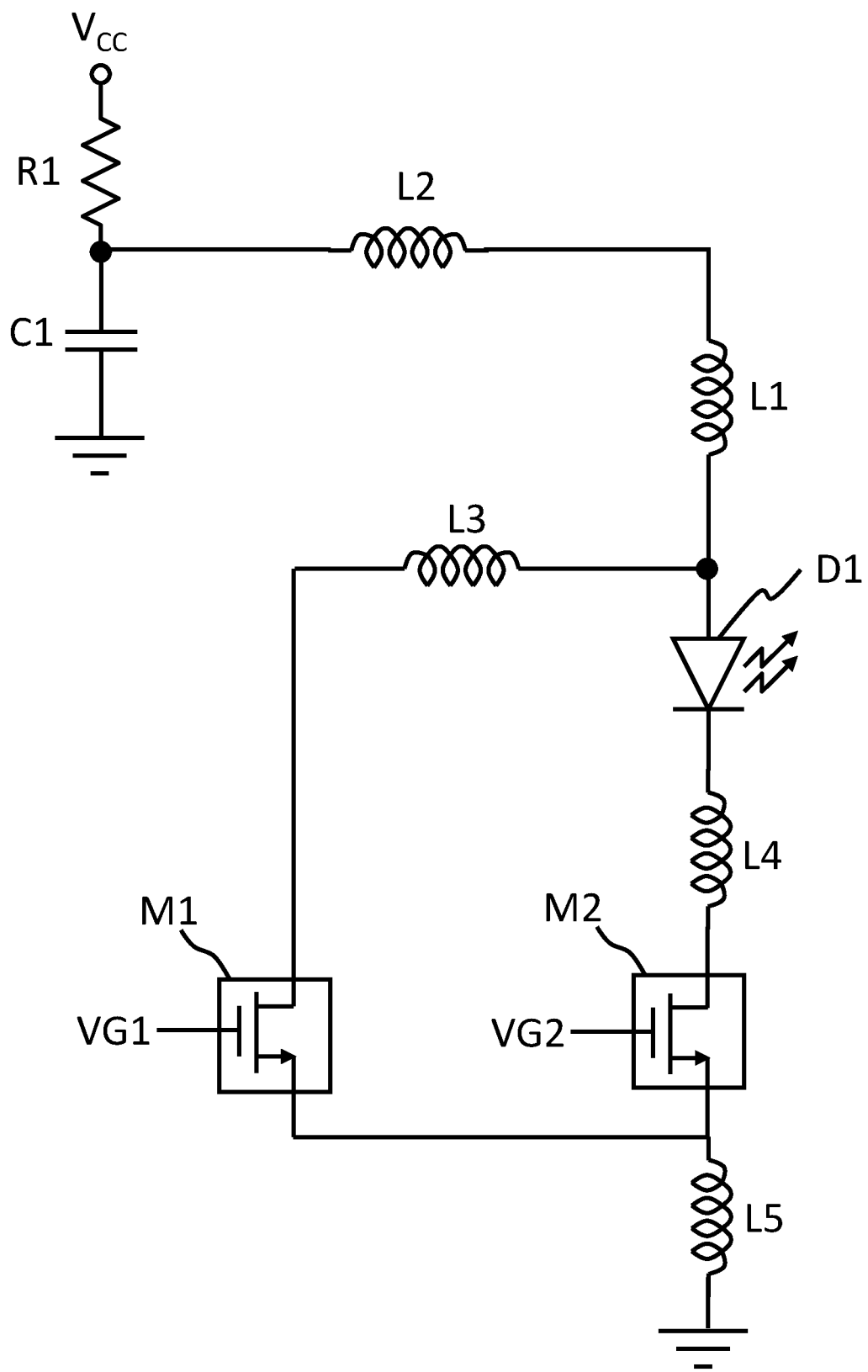
FIG. 2 shows an illustrative pulsed laser diode driver circuit and diode, according to some embodiments of the disclosure.

To address the limitations described above (e.g., caused by in-circuit bondwire inductance and FET turn-on times), an improved pulsed laser diode driver circuit provides an elegant solution. The driver circuit may be offered in a single chip solution. FIG. 2 shows an illustrative pulsed laser diode driver circuit and diode, according to some embodiments of the disclosure. The circuit seen in FIG. 2 includes some of the same components illustrated by FIGS. 1A-B. For instance, a capacitor C1 is provided for accumulating pulse charge, and can be charged through resistor R1 (e.g., during a relatively long interval between pulses). Series resistor R1 is optional. However, the circuit in FIG. 2 differs from FIG. 1A, where the circuit in FIG. 2 has not just one, but two paths for current to travel. The circuit in FIG. 2 for pulsing a (laser) diode therein includes a first circuit path comprising one or more inductive elements (e.g., L2, L1, and L3) and a first switch M1 (e.g., the first switch M1 being between the inductances and ground), and a second circuit path comprising the diode D1 and a second switch M2 (e.g., the second switch M2 being between the diode D1 and ground). L1 and L3 model bondwire inductances. L2 models the inductance between the charging capacitor C1 and the bondwire, or can also include inductance within the capacitor C1. L2 might be smaller than L1, L3.

Two switches M1 and M2 are provided to select which path the current travels during different intervals. One circuit path, i.e., a pre-charge path, can be used for pre-charging the inductance(s) during one interval, and the stored energy or current in the inductance(s) can be dumped very quickly towards the diode D1 using a separate circuit path, i.e., a fire path, to turn on the diode D1 during a subsequent interval. A switch timing controller can be provided to control the switches M1 and M2. The switch timing controller can vary its control signals to the switches M1 and M2 depending on the characteristics of the pulse to be generated (e.g., pulse width, pulse period, etc.).

Switches can be implemented using a suitable transistor (e.g., complementary metal-oxide semiconductor (CMOS) device as illustrated in FIG. 2). The gate voltages (e.g., VG1 and VG2 as shown) can be controlled by control signals to turn on the transistor (conducting current) or turn off the transistor (not conducting current) during different intervals. Equivalently, the gate voltages can be controlled by control signals to close the switch (conducting current) or open the switch (not conducting current) during different intervals. When a switch is closed, current to flows through the switch with little to no resistance; when a switch is open, current does not conduct through the switch (the switch becomes very high impedance/resistance).

A switching scheme can be implemented to control the first switch M1 and the second switch M2, where the scheme includes pre-defined states of the first switch M1 and the second switch M2 during different intervals. The states of the first switch M1 and the second switch M2 allows pre-charging energy or current in the one or more inductive elements in the first circuit path prior to flowing the energy or current through the second circuit path to pulse the diode.

The first circuit path can conduct current so that the inductances L2, L1, and L3 can be pre-charged prior to turning on the diode D1 to make sure the diode turn-on is no longer or less affected by the lag caused by the inductances. After some period of pre-charging of the inductances, the first circuit path becomes an open circuit so that current no longer flows through the first circuit path, and current flows through the second circuit path. As a result, the current flowing through the second circuit path quickly turns on diode D1. The resulting circuit effectively addresses the limitations of circuits such as the one seen in FIGS. 1A-B, i.e., the limited turn-on time of a FET driver, and the in-circuit inductances connecting the driver and the laser diode to the supply.

FIG. 2 is shown as an illustration, it is understood that variations to the circuit are envisioned by the disclosure. Other topologies and means can be implemented to provide the circuit path(s) for pre-charging inductances in the circuit prior to turning on the diode.

Technical Improvements and Advantages of the Improved Driver

Gate drive pulse width and period can vary by application. In some cases, the pulse width can have a minimum of 4 nanoseconds or less and maximum of 25 nanoseconds, with a pulse repetition period having a minimum of 100 nanoseconds and maximum of 1 microsecond (or even 100 microseconds). Narrower pulses are needed to increase measurement resolution and allow for higher peak power to increase signal to noise ratio (SNR). Circuit shown in FIG. 2 and an appropriate switching scheme can easily meet these application requirements.

One technical improvement of the circuit illustrated in FIG. 2 and other embodiments following the same or similar switching scheme is that the turn-on time for the diode is no longer dependent on the FET turn-on time (which is limited due to the gate charge and parasitic capacitances of the transistor). Instead, switch M1 of the circuit in FIG. 2 turns on first to pre-charge energy or current in the inductances L2 and L1 between the laser supply voltage and the laser diode D1 anode, along with L3 between the laser diode D1 anode and switch M1 and L5 between ground and switch M1. The laser diode D1 remains turned-off during the pre-charge phase through isolation by open switch M2. Next, switch M2 turns on. Diode D1 remains off as switch M1 shorts the inductances to ground and the diode D1 provides sufficient resistance to have (practically all of) the current flow through the switch M1 instead of the diode D1 and the switch M2. Then, switch M1 turns off. Resistance of M1 increases as M1 turns off, forcing the stored energy or current pre-charged in the inductances (e.g., L2 and L1) to flow through the path having the laser diode D1 and switch M2 very quickly. Laser diode D1 on resistance $R_{on}$ is can be less than several hundred milliOhms, or even less than 100 milliOhms (depending on the type of diode). This means the laser diode can turn on very quickly, and the FET turn-on time is no longer critical, since it will not limit the speed of the laser diode D1 turn-on. The speed of the laser diode D1 turn on time now depends on how quickly M1 turns off (or how quickly the resistance rises when M1 turns off), which can be very fast (much faster than the speed of turning a transistor on, e.g., within 100's of picoseconds). In various embodiments, switch M2 can be closed just after switch M1 is opened, at the same time when M1 is opened, or just before switch M1 is opened. These embodiments all have the benefit of pre-charging inductances L2, L1, and L3 prior to firing of diode D1, as long as the switch M1 is closed for a sufficient amount of time to pre-charge the energy in the inductances L2, L1, and L3.

Another improvement of the circuit illustrated in FIG. 2 is that the inductances are no longer a limiting factor for di/dt of the current (change in current over change in time) when pulsing the diode on. As explained with FIGS. 1A-B, the inductances can limit the di/dt of the current that can flow through the laser diode). By using the switch M1 to pre-charge the circuit inductances, the circuit inductances can be included in the "pre-charge path" and pre-charged during the period just before the laser diode turns on.

Referring back to FIG. 2, in some embodiments, multiple inductances in the circuit can be taken into account and included in one or more "pre-charge paths", such as the inductances L2 from the supply, inductances L1, L3, and/or L4 from any bondwires connecting the laser diode to the driver, and/or inductance L5 between the switches and ground, to greatly mitigate the di/dt limitations due to the inductances.

Even in the presence of these inductances, the circuit seen in FIG. 2 can achieve a di/dt exceeding 20 Amps per nanosecond (A/ns) with a modest supply voltage $V_{CC}$ of 10 volts. Using existing circuit topologies with the same inductances results in di/di much less than 10 A/ns. For Time-of-Flight applications, the depth/distance accuracy improves with narrower pulses, and the circuit illustrated in FIG. 2 along with the appropriate switching scheme can improve the performance of the overall system by providing fastest possible rise and fall times with high peak currents.

Furthermore, the switches M1 and M2 of the circuit of FIG. 2 can be implemented with standard low voltage complementary metal-oxide semiconductor (CMOS) device. The CMOS process can facilitate integration of the gate drive circuitry and other logic together with the high current driver.

The Switching Scheme

To explain the switching scheme in greater detail, FIGS. 3-7 illustrate different states of the pulsed laser diode driver circuit during different intervals, according to some embodiments of the disclosure. FIGS. 3-7 show a model of the pulsed laser diode driver circuit and the diode. In some embodiments, the supply $V_{CC}$ can be +10 V. The embodiments disclosed herein can work with other supply voltages. The pulsed laser diode driver circuit drives the (laser) diode D1, and the driver circuit includes a first switch S1 and a second switch S2 (e.g., modeling the transistors M1 and M2 seen in FIG. 2). The inductances are modeled by inductance L for simplicity. Corresponding to FIGS. 3-7 and various embodiments disclosed herein, FIG. 8 shows a flow diagram illustrating a method for pulsing a laser diode, according to some embodiments of the disclosure.

Figure 3:
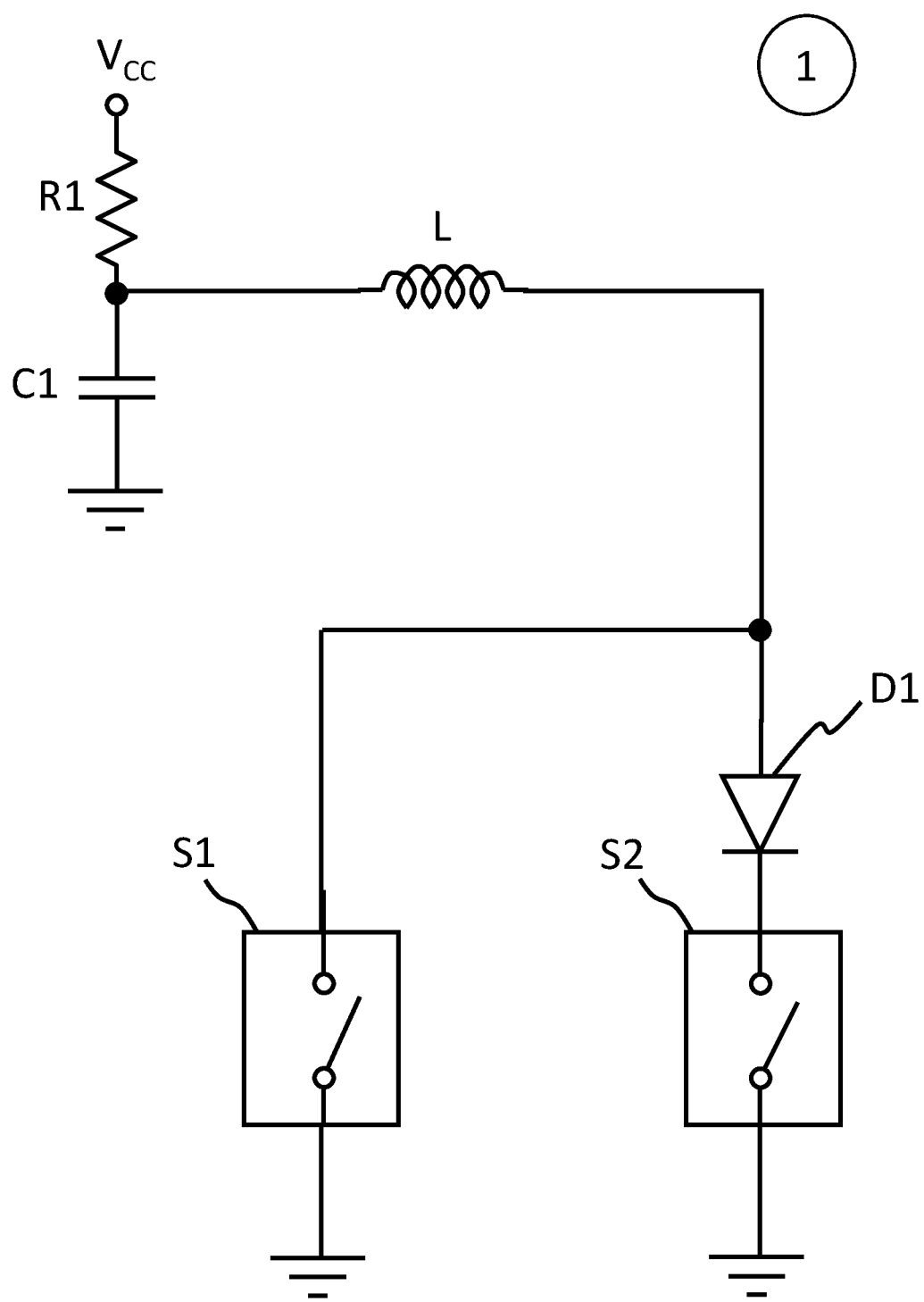
FIGS. 3-7 illustrate different states of the pulsed laser diode driver circuit during different intervals, according to some embodiments of the disclosure.

FIG. 3 illustrates the state of the switches S1 and S2 for accumulating pulse charge during a first interval (task 802). The capacitor can be charged to a desire voltage for the pulse driver circuit. Accumulating pulse charge can include charging a capacitor. Capacitor C1 can accumulate pulse charge, and can be charged through (optional) resistor R1 connected to a voltage supply (e.g., $V_{CC}$). The pulse charge is later supplied as current or energy to pre-charge inductance L and to fire the diode D1. The accumulation of pulse charge can occur during a relatively long interval between pulses. During this interval, the first switch S1 and the second switch S2 are open. Neither the first switch S1 nor the second switch S2 conducts current. The diode D1 is off.

Figure 4:
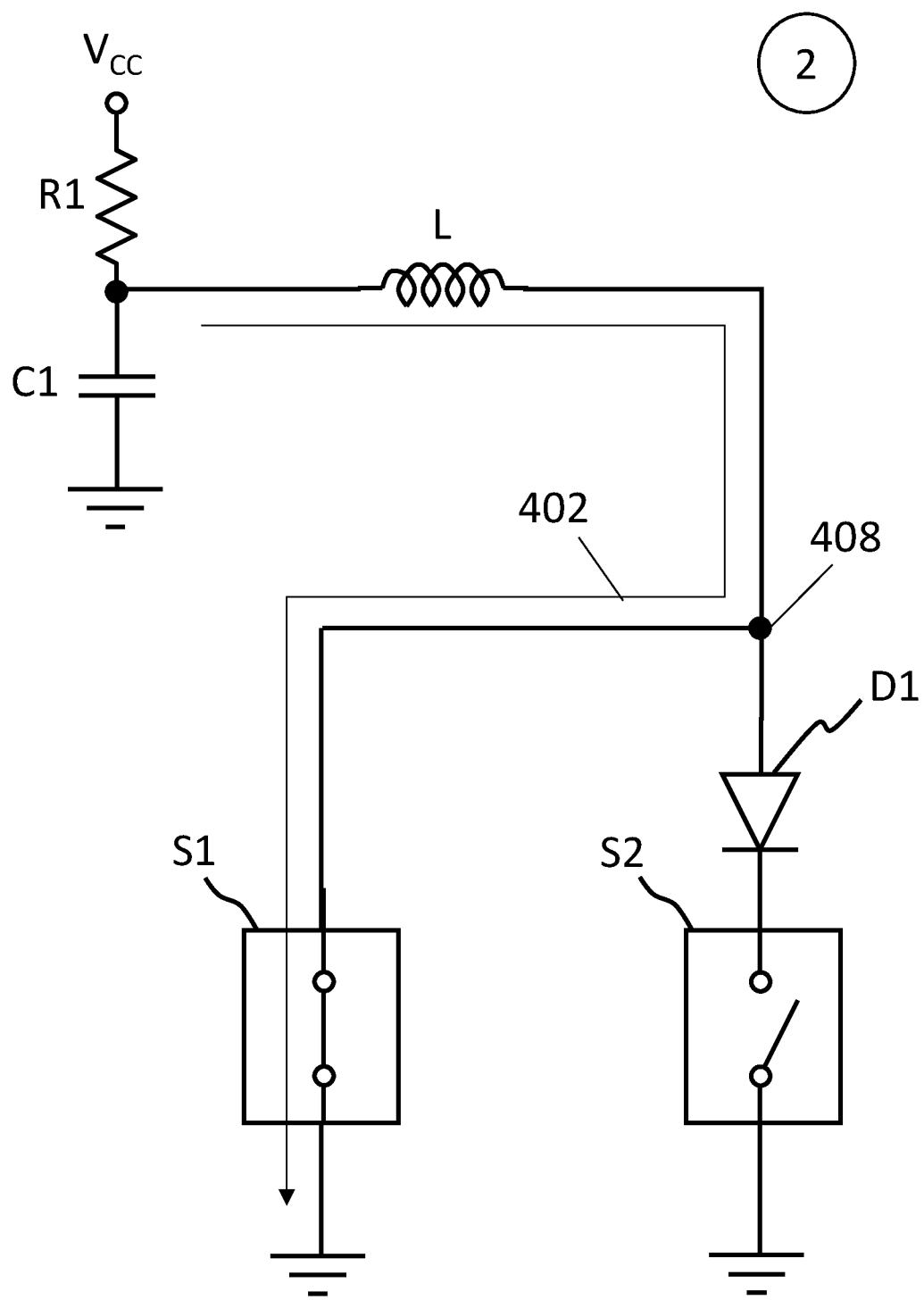

FIG. 4 illustrates closing a first switch S1 to conduct current through one or more inductive elements and the first switch S1 during a second interval (task 804). The first switch S1 is closed, and the second switch S2 remains open. The first switch S1 can conduct current. The first switch S1 shorts the inductance L to ground, pulling the accumulated charge or pulse current from C1 through inductance L towards ground. During this interval, the accumulated charge or pulse current from capacitor C1 flows over the circuit path 402, through inductance L and the first switch S1 to pre-charge the inductance L (e.g., including inductance of bondwire to the diode D1). The circuit path 402 is referred herein as the "pre-charge path". Energy or current is stored on the inductance L during this interval. The second switch S2 is open, and thus no current conducts through the second switch S2. Diode D1 is off. Closing the first switch completes the first conductive path 402, i.e., the "pre-charge path" for the current to flow through the first switch S1 and the one or more inductive elements.

Figure 5:
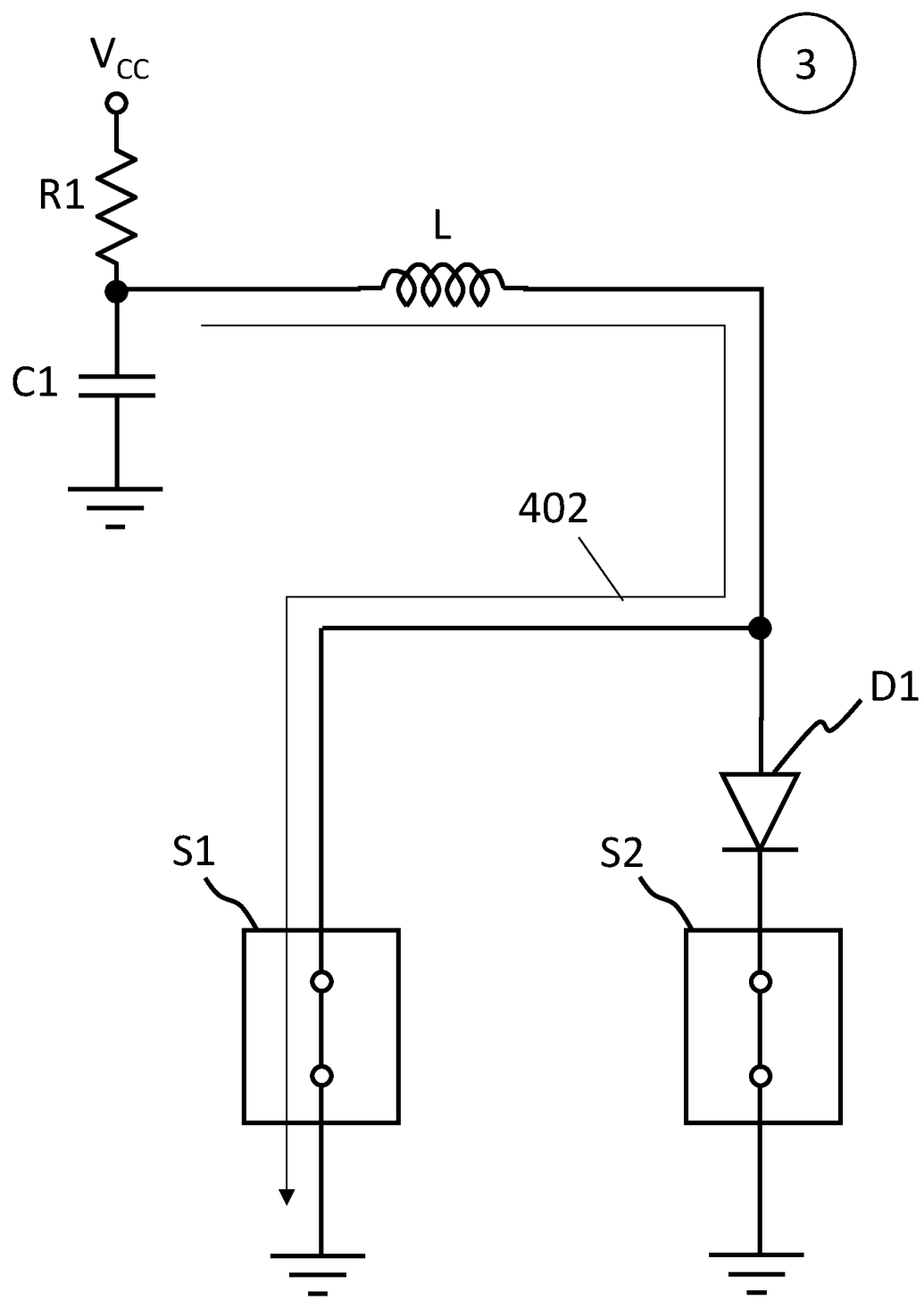

FIG. 5 illustrates closing a second switch S2 in series with the diode D1 (between the diode and ground or in some alternative embodiments, the second switch S2 is between the diode and node 408) during a third interval (task 806). The first switch S1 is closed, and the second switch S2 is closed. During this interval, all of the current continues to flow through circuit path 402, since the diode D1 is still reverse-biased and remains off.

Figure 6:
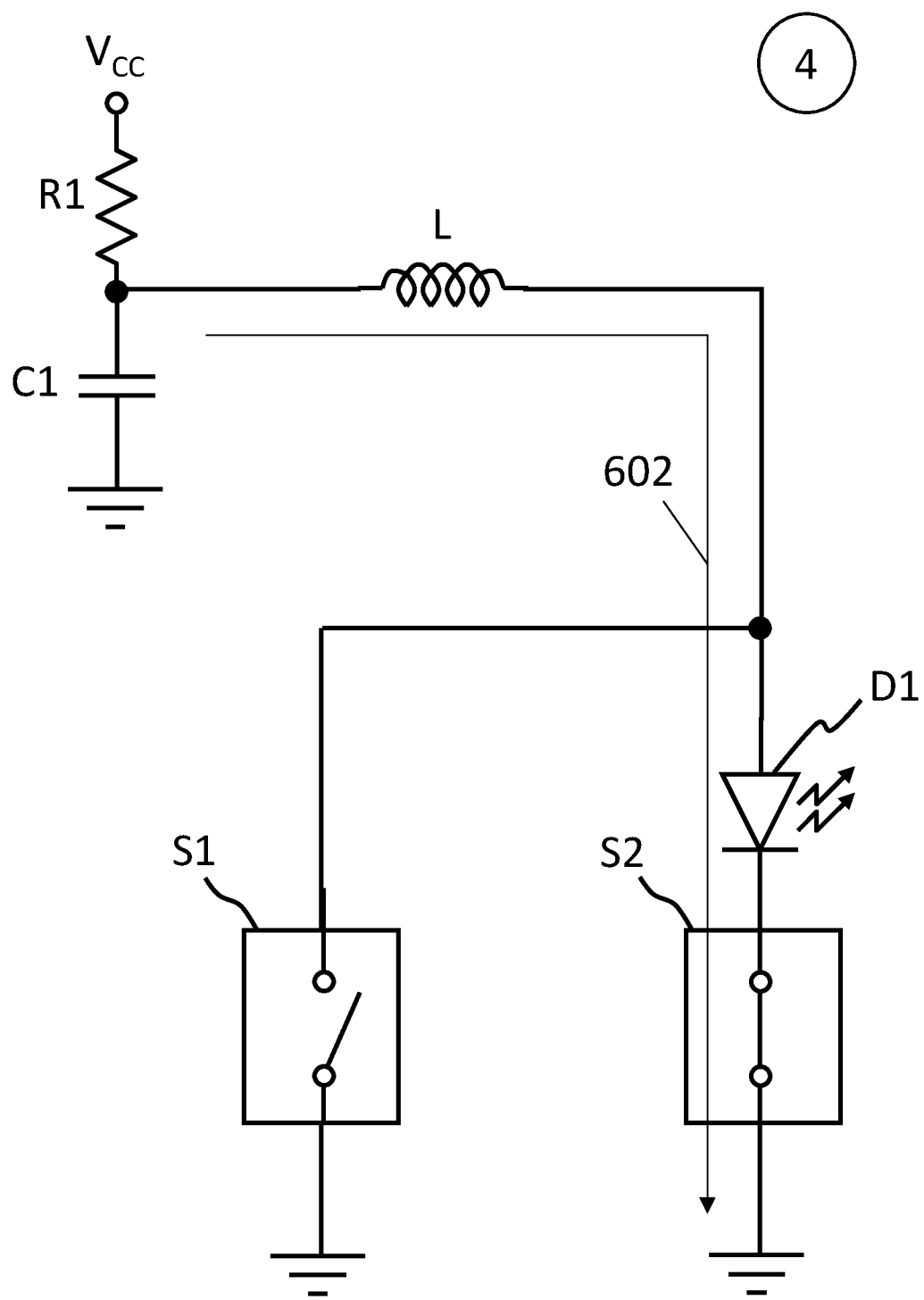

FIG. 6 illustrates opening the first switch S1 during a fourth interval to flow current through the diode D1 and the second switch S2 during a fourth interval (task 808). The first switch S1 is open and the second switch S2 remains closed. During this interval, the opening of the first switch S1 causes the energy or current (e.g., stored in the inductance L) to flow through the circuit path 602 through diode D1 and switch S2. The circuit path 602 is referred herein as the "fire path". The dumping of the current over the circuit path 602 quickly pulses and fires the diode D1, and the diode D1 turns on. The di/dt during this interval can reach 20 A/ns with an exemplary $V_{CC}$=+10V supply.

In some embodiments, the second switch S2 is closed at the same time when the first switch S1 is opened. In some embodiments, the second switch S2 is closed just after the first switch S1 is opened. Steps illustrated by FIGS. 5-6, i.e., closing of the second switch S2 and opening of the first switch S1, open the first conductive path (i.e., the "pre-charge path") and complete a second conductive path (i.e., "the fire path") for the current to flow through the diode D1. Closing the second switch S2 completes a second circuit path (i.e., "the fire path") having the diode, and opening the first switch S1 opens a first circuit path (i.e., "the pre-charge path") to allow the current (previously flowing through the "pre-charge path") to flow through the second circuit path. The relative timing of the two tasks 806 and 808 illustrated by FIGS. 5-6 can vary, and the overall scheme can still have the benefit of being able to pre-charge the inductances in the circuit.

Figure 7:
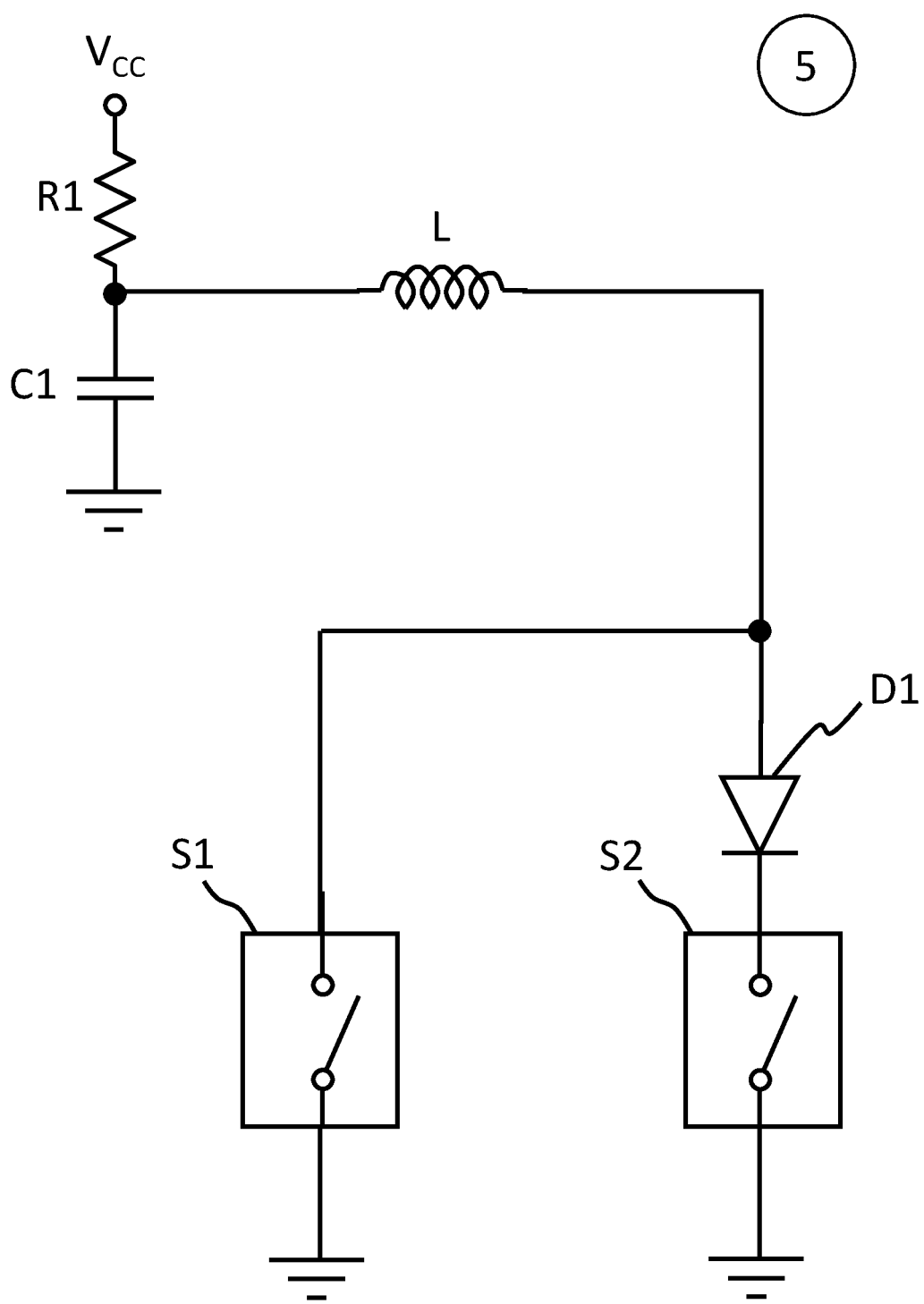
Figure 8:
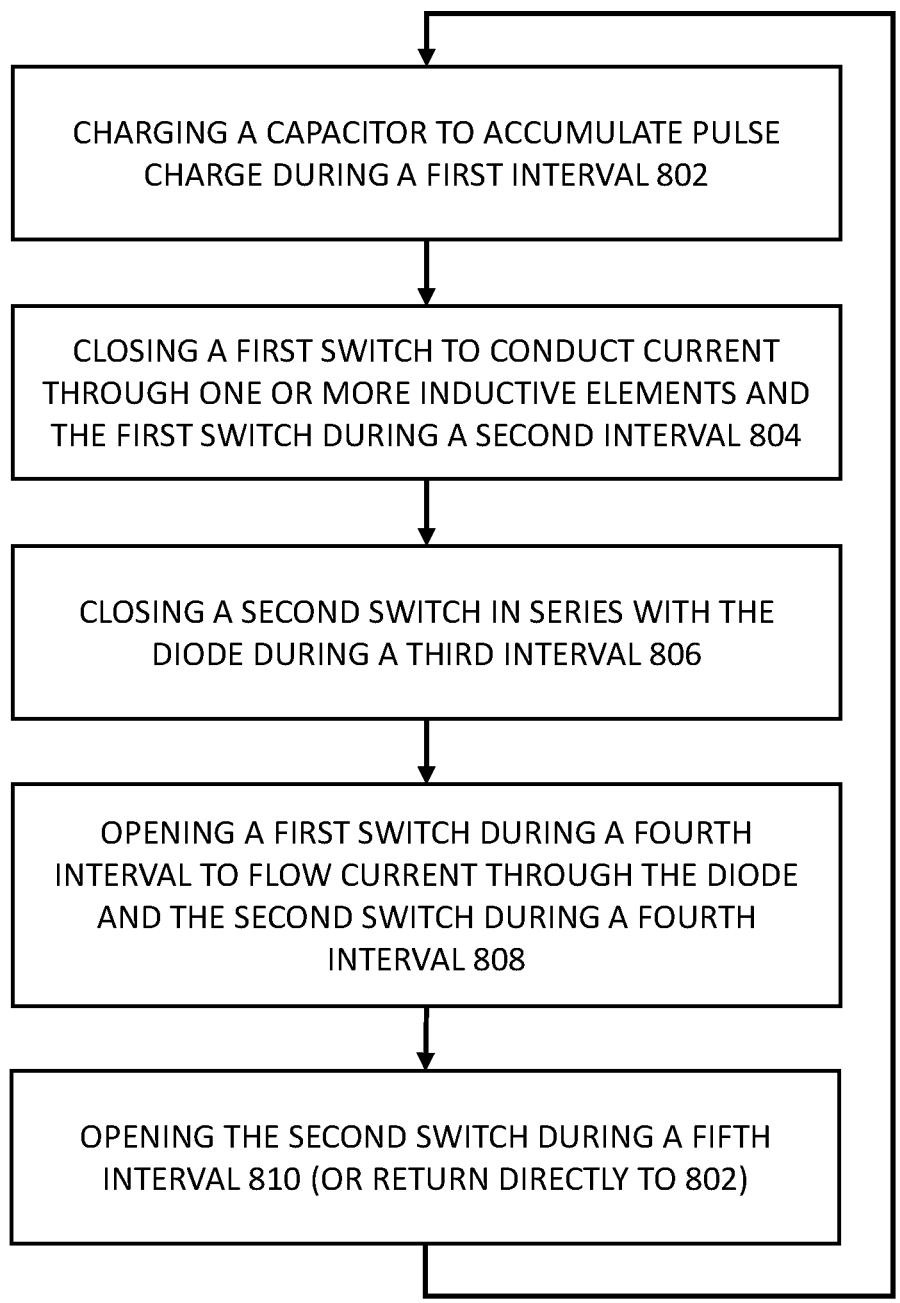
FIG. 8 shows a flow diagram illustrating a method for pulsing a laser diode, according to some embodiments of the disclosure.

FIG. 7 illustrates opening the second switch S2 during a fifth interval (task 810). The first switch S1 is open, and the second switch S2 is open. Neither switches are conducting current. Both the "pre-charge path" and the "fire path" are open and not conducting current. A separate interval may not be needed, as the states of the first switch S2 and the second switch S2 reverts the circuit back the illustration in FIG. 3. During this fifth interval (or equivalently, returning to the first interval), the capacitor C1 once again accumulates pulse charge for the next pulse. The switching scheme continues.

The following table summarizes an exemplary switching scheme:

|  | Interval 1 | Interval 2 | Interval 3 | Interval 4 | Interval 5* |
|---|---|---|---|---|---|
| FIG. | 3 | 4 | 5 | 6 | 7 |
| Task | 802 | 804 | 806 | 808 | 810 |
| Exemplary Duration | 10 ns-1 us | a few ns | a few ns | 4 ns-25 ns | depends on application |
| S1 | Open | Closed | Closed | Open | Open |
| S2 | Open | Open | Closed | Closed | Open |
| D1 | Off | Off | Off | On | Off |

*can be eliminated as it serves the same purpose as Interval 1

Illustrative Circuit Topology for Pre-Charging Inductances

More complex variations of this circuit are also possible. For instance, additional switches for differential charging of the additional inductance(s) between the laser diode cathode and ground, are possible. Other suitable topologies having the "pre-charge path", "fire path", and an appropriate switching scheme to implement pre-charging of inductances and fast firing of the diode are envisioned by the disclosure.

Referring back to FIG. 2, the inductances L4 and L5 would not typically be bondwires, but in some cases inductances L4 and L5 are bondwires in a different packaging solution, and might benefit from pre-charging.

Figure 9:
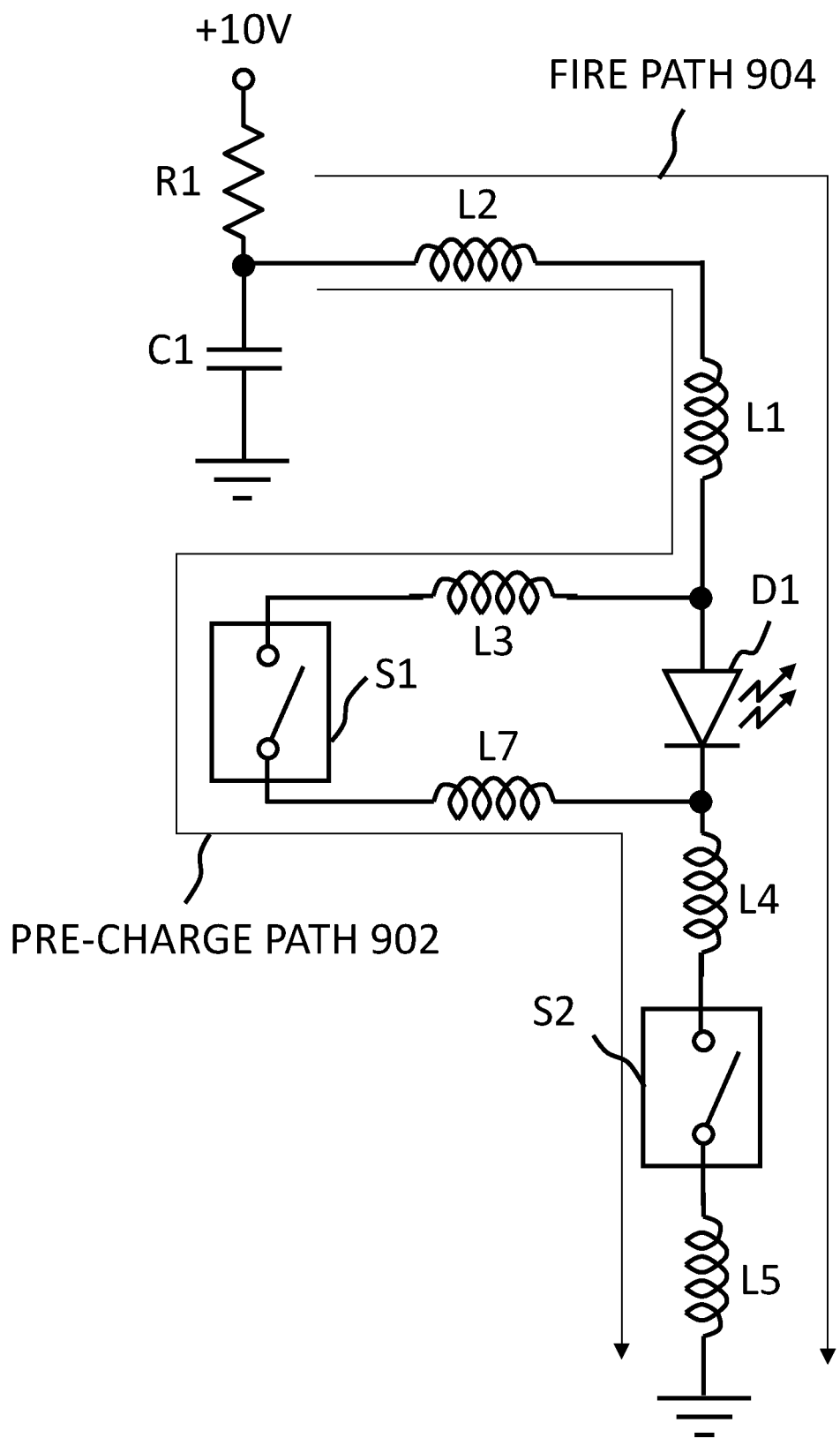
FIG. 9 shows an illustrative pulsed laser diode driver circuit and diode, according to some embodiments of the disclosure.

FIG. 9 shows an illustrative pulsed laser diode driver circuit and diode, according to some embodiments of the disclosure. When switches S1 and S2 are open, capacitor C1 accumulates current. When switches S1 and S2 are closed, the inductances L2, L1, L3, L7, L4, and L5 (of the pre-charge path 902) are shorted to ground, and are pre-charged by the pulse charge from C1. Switches S1 and S2 being closed completes the pre-charge path 902, which has inductances L2, L1, L3, L7, L4, and L5 (in series). The diode D1 is biased in such a way that the diode D1 does not turn on when the inductances pre-charges, by carefully controlling the switches S1 and S2 switching time when they are closed. For instance, closing S1 and S2 can complete the pre-charge path. S1 can be closed just before closing S2, or S1 and S2 are closed simultaneously. At this time, because diode D1 is not turned on (i.e., off or reverse biased), diode D1 acts as an open circuit. Accordingly, the fire path 904, having inductance L2, inductance L2, diode D1, inductance L4, and inductance L5 (in series), cannot be completed. After a period of pre-charging, switch S1 can open, which causes the pulse current from C1 and energy stored in L2 and L1 to flow to the diode D1, thus turning the diode D1 on. Phrased differently, switch S2 can be closed to complete the fire path, and opening S1 can allow the current to flow through the fire path. Opening switch S1 opens the pre-charge path and current conducts through the fire path 904. Opening switch S2 can return the circuit back to the state where the capacitors C1 can accumulate pulse current.

Variations and Implementations

Figure 10:
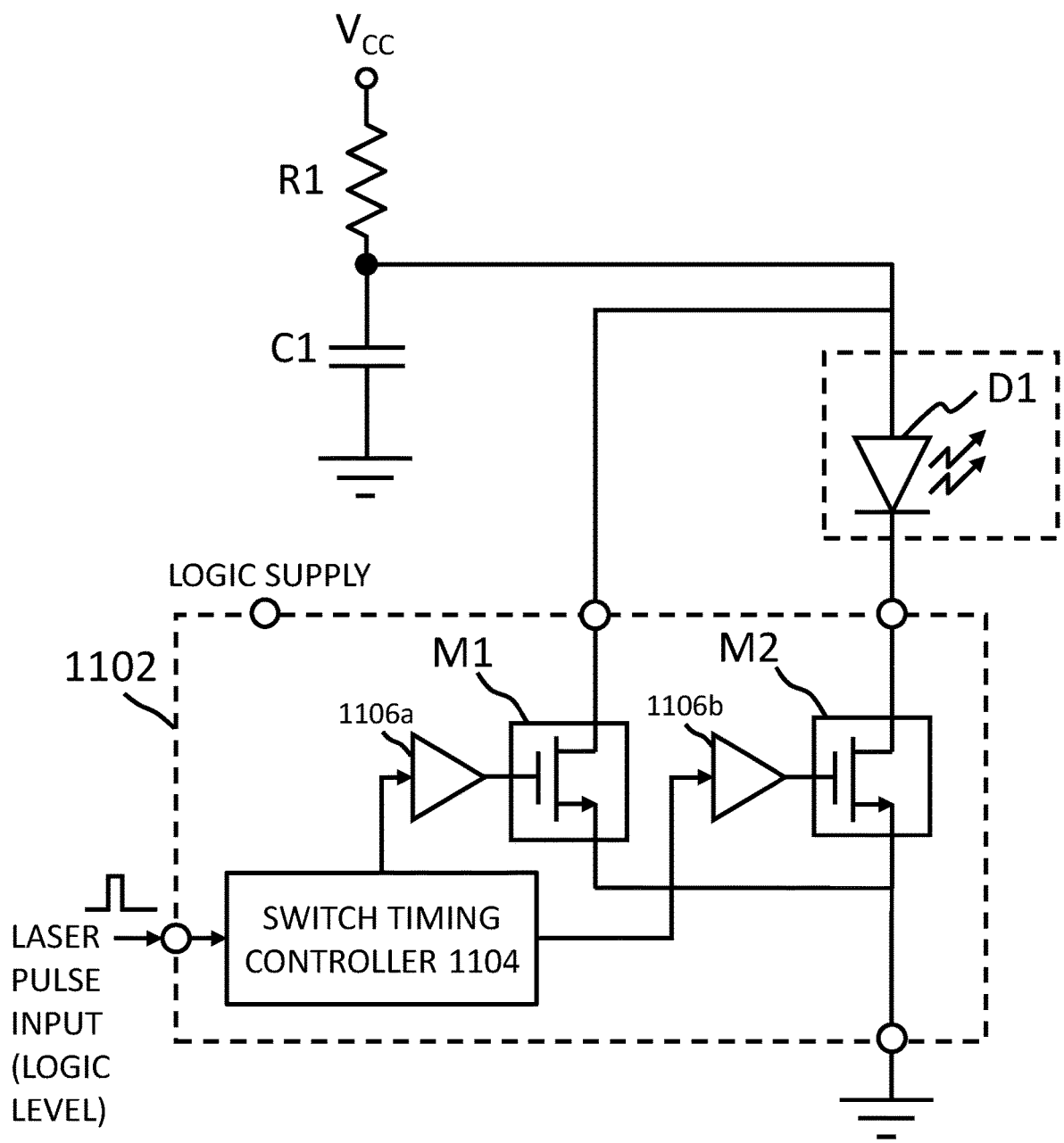
FIG. 10 shows a system diagram of an illustrative pulsed laser diode driver circuit and diode according to some embodiments of the disclosure.

FIG. 10 shows a system diagram of an illustrative pulsed laser diode driver circuit and diode according to some embodiments of the disclosure. Similar to other figures, R1 and C1 are provided to accumulate pulse charge. R1 and C1 are usually not provided on the same substrate as D1, and R1 and C1 can be connected to D1 through bondwires or conductors. The diode D1 can be driven by pulsed laser diode driver 1102. The pulsed laser diode driver 1102 is an integrated circuit or chip comprising switches M1, M2, gate drivers 1106a-b, and a switching timing controller 1104. Switches M1, M2, gate drivers 1106a-b, and a switching timing controller 1104 are provided on the same substrate. The switch timing controller 1104 can receive a laser pulse input (logic level), i.e., a logic input signal, as input. The laser pulse input can signal that D1 should turn on (e.g., a logical HIGH can signal D1 should turn on). Based on the laser pulse input, the switch timing controller 1104 can generate appropriate control signals, e.g., voltages, to control gate drivers 1106a-b to turn M1 and M2 on or off (e.g., to open or close M1 or M2) during intervals in response to the logical input signal according to the switching schemes described herein. In some embodiments, the laser diode D1 and the pulsed laser diode driver 1102 can be co-packaged as a single integrated package.

In some embodiments, rather than driving one laser diode, the pulse laser diode driver may be driving multiple laser diodes. In such multi-channel implementation, the principle operation of having different circuit paths for pre-charging and quickly firing the laser diode still applies. Specifically, the principle operation continues to have at least two phases: pre-charging via one circuit path (i.e., "pre-charge path"), and firing via another circuit path (i.e., "fire path"). Circuit configurations can be implemented for use with common cathode or common anode connections of the laser diodes, since the laser diodes may be connected with their cathodes or anodes shorted together. This configuration may pose a challenge since the driver may need to isolate the operation of each channel. Phrased differently, when pre-charging and firing channel 1 (i.e., laser diode 1), circuitry may be implemented to prevent the other channels (i.e., other laser diodes) from firing. In some multichannel applications, the lasers may be pulsed separately at various rates (i.e., 10 KHz, 100 KHz, 1M, etc.), and isolating the channels can ensure proper operation. The supply voltages to the different lasers may also differ. The integrated circuit of FIG. 10 can be adapted to include more inputs, switches, and gate drivers, since more diodes have to be selected and/or driven. The switch timing controller 1104 of FIG. 10 may also be adapted to not only implement the opening/closing of switches to open/complete the pre-charge and fire paths, but to also implement a selection of one or more diodes to fire while keeping the rest of the diodes off (i.e., isolating of the channels).

FIGS. 11-14 and 16 illustrate various driver circuits for driving multiple diodes. The exemplary circuits illustrate providing at least one pre-charge path and plurality of firing paths that can select a channel/diode to fire.

Figure 11:
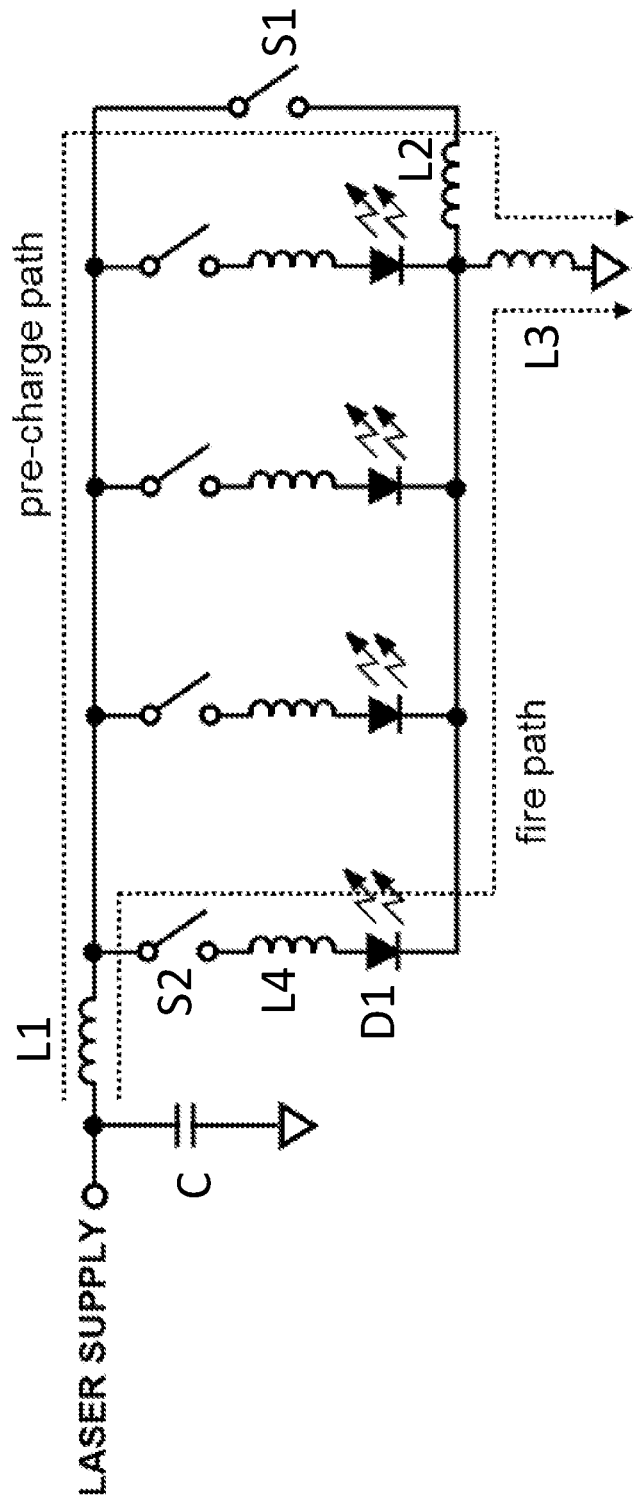
FIGS. 11-14 illustrate various driver circuit for driving multiple diodes, according to some embodiments of the disclosure.

FIG. 11 shows a multi-channel circuit architecture for driving (e.g., 4, but any number of channels can be included) laser diodes having a common cathode connection (or configuration). Prior to pre-charging inductances, capacitor C is charge to a desired voltage. C is connected to laser supply (e.g., any suitable voltage source, voltage supply) and to ground. The pre-charge path is shared among all the laser diodes. One or more switches dedicated to each laser diode can be used to select and fire a corresponding laser diode. The switches are opened or closed depending on the path to be implemented to be used at a given time. The pre-charge path is illustrated by the path of one arrow labeled "pre-charge path". In this example, the pre-charge path includes inductances L1, L2, and L3 (in series) and the pre-charge path can be completed by closing switch S1. An exemplary fire path for diode D1 is illustrated by the path of another arrow labeled "fire path". In this example, the fire path includes inductance L1, switch S2, inductance L4, diode D1, and inductance L3 (in series). Such circuit architecture, i.e., the pre-charge path, can compensate for inductance in the ground loop path. Closing the switch S2 (while keeping other switches in series with the other diodes open) and opening switch S1 (after pre-charging of inductances has occurred) can select the diode D1 from a plurality of diodes and fire the diode D1.

Figure 12:
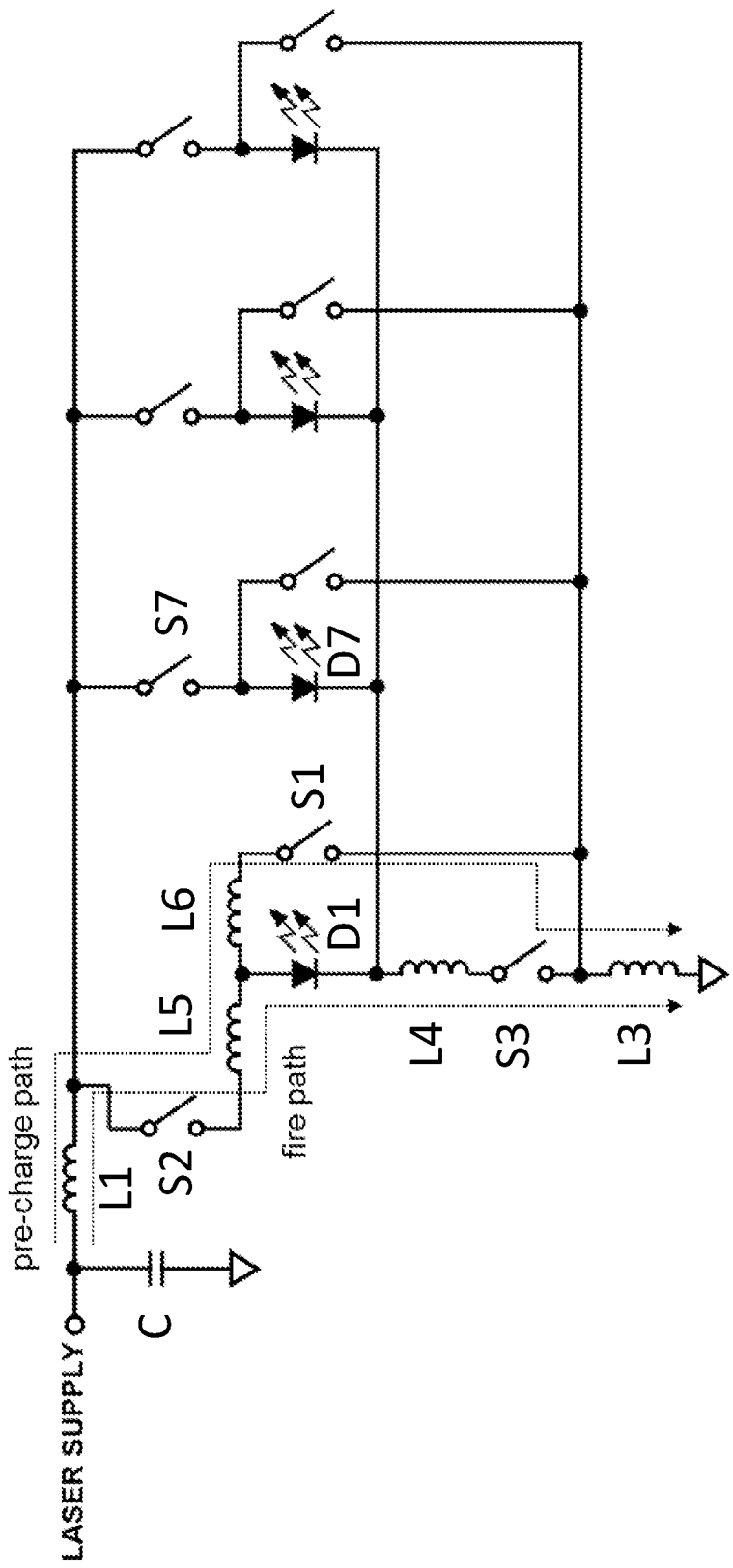

FIG. 12 shows another multi-channel circuit architecture for driving laser diodes having a common cathode connection (or configuration). Each channel has a corresponding pre-charge path and a corresponding fire path. Switches are opened or closed depending on the path to be implemented at a given time. Keeping one or more switches open in a particular path can ensure no current flows through that particular path, or can ensure that a particular channel is turned off. An exemplary pre-charge path provided for laser diode D1 is illustrated by the path of one arrow labeled "pre-charge path". The exemplary pre-charge path has inductances L1, L5, L6, and L3 (in series). An exemplary fire path for laser diode D1 is illustrated by the path of another arrow labeled "fire path". The exemplary fire path has inductance L1, inductance L5, diode D1, inductance L4, and inductance L3 (in series). A set of pre-charge path and fire path is replicated/provided for the rest of the laser diodes respectively. To avoid cluttering up the FIGURE, some of the inductances such as L5, L6, and L4, and switch S3 shown for the channel having diode D1, while are present in the circuit for other channels as well, are not shown for the rest of the channels. This exemplary circuit architecture, i.e., the pre-charge path, can compensate for inductances in the laser anode path and the ground loop path. One or more switches dedicated to each laser diode or channel can be used to select and utilize a given pre-charge path. For instance, having switches S2 and S1 closed can complete the pre-charge path for diode D1. One or more switches dedicated to each laser diode can be used to select and fire a corresponding laser diode. Having switches S2 and S3 closed can complete the fire path for diode D1. To use the pre-charge path, switches S1 and S2 are closed while switch S3 in series with diode D1 is open. Switch S3 is closed to complete the fire path (but it is possible that no current will flow through the fire path at this point). To change from flowing current through the pre-charge path to the fire path, switch S1 is opened (switch S2 remains closed) to allow the current to flow through the fire path. Switch S2 can select the channel having diode D1, switch S7 can select the channel having diode D7, and so on.

Figure 13:
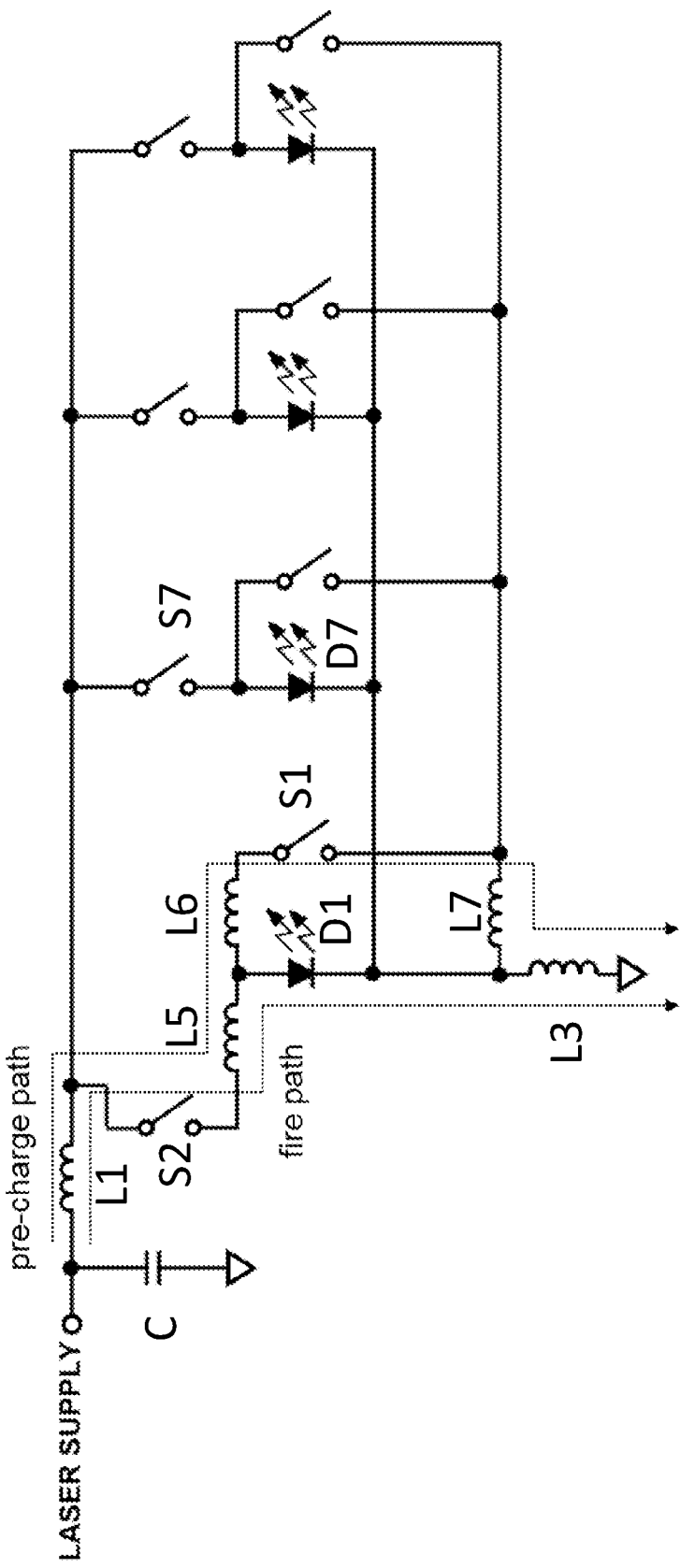

FIG. 13 shows another multi-channel circuit architecture for driving laser diodes having a common cathode connection (or configuration). FIG. 13 differs from FIG. 12 in that inductance L4 and switch S3 of FIG. 12 are not present in FIG. 13, and L7 of FIG. 12 is not present in FIG. 12. Each channel has a corresponding pre-charge path and a corresponding fire path. Switches are opened or closed depending on the path to be implemented at a given time. Keeping one or more switches open in a particular pre-charge or fire path can ensure no current flows through that particular path, or can ensure that a particular channel is turned off. An exemplary pre-charge path for diode D1 is illustrated by the path of one arrow labeled "pre-charge path". The exemplary pre-charge path has inductances L1, L5, L6, L7 and L3 (in series). An exemplary fire path for diode D1 is illustrated by the path of another arrow labeled "fire path". The exemplary fire path has inductance L1, inductance L5, diode D1, and inductance L3 (in series). A set of pre-charge path and fire path is replicated/provided for the rest of the laser diodes respectively. To avoid cluttering up the FIGURE, some of the inductances such as L5, L6 shown for the channel having diode D1, while are present in the circuit for other channels as well, are not shown for the rest of the channels. This exemplary circuit architecture compensates for inductances in the laser anode path, the laser cathode path, and the ground loop path. One or more switches dedicated to each laser diode or channel can be used to select and utilize a given pre-charge path. For instance, having switches S2 and S1 closed can complete the pre-charge path for diode D1. One or more switches dedicated to each laser diode can be used to select and fire a corresponding laser diode. Having switch S2 closed can complete the fire path for diode D1. To use the pre-charge path, switches S1 and S2 are closed while D1 is reversed biased or off. Because diode D1 is not turned on (i.e., off or reverse biased), diode D1 acts as an open circuit so that no current flows through the fire path for diode D1. Switch S2 being in a closed state can complete the fire path for diode D1, but no current will flow through the fire path at this point due to the diode D1 being off. To change from flowing current through the pre-charge path to the fire path, switch S1 is opened (switch S2 remains closed) to allow the current to flow through the fire path. Switch S2 can select the channel having diode D1, switch S7 can select the channel having diode D7, and so on.

Figure 14:
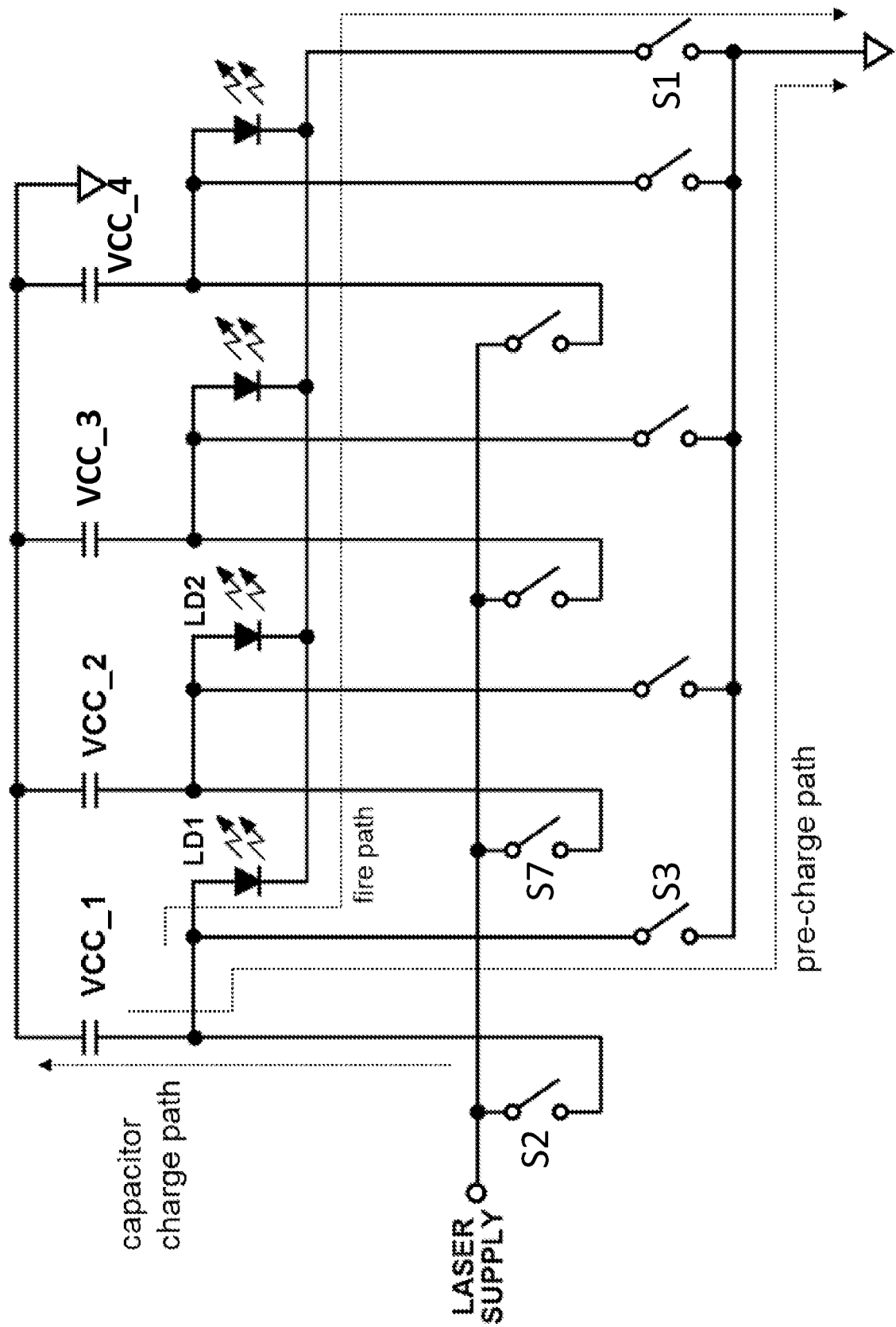
Figure 15:
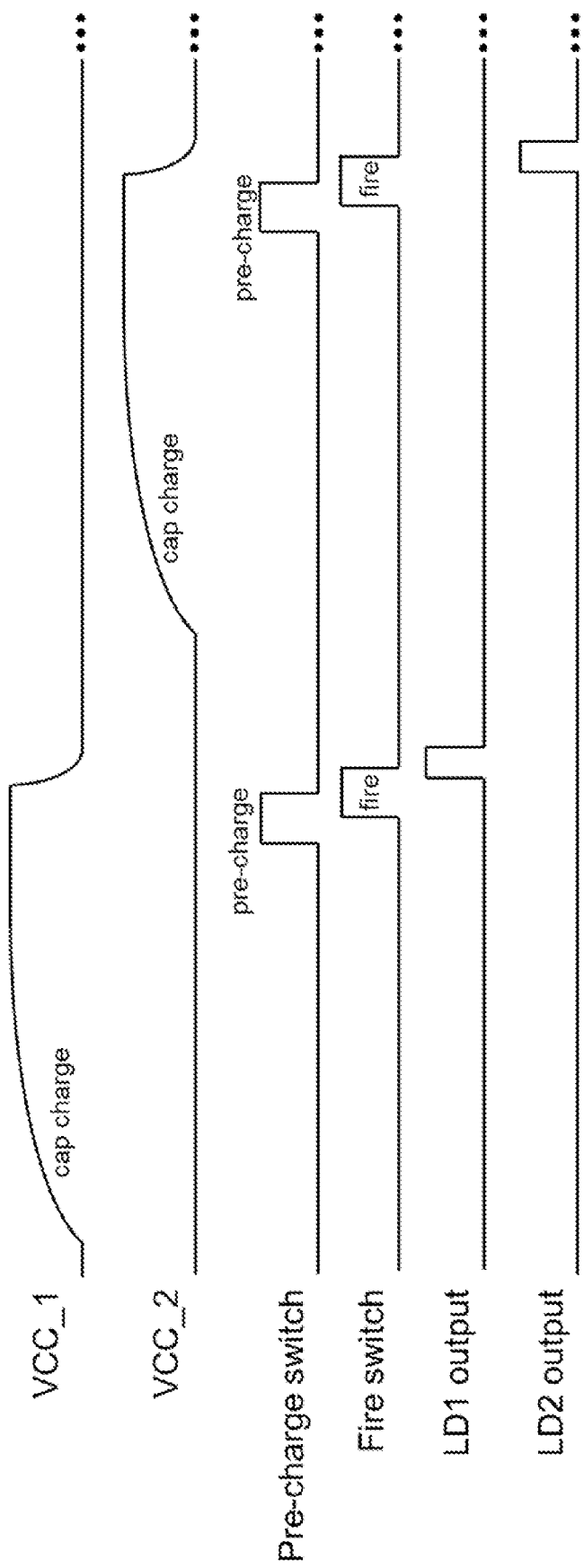
FIG. 15 shows a timing diagram for the circuit shown in FIG. 14, according to some embodiments of the disclosure.

FIG. 14 shows another multi-channel circuit architecture for driving laser diodes having a common cathode connection (or configuration). In this example, separate reservoir capacitors allow separate supply voltage nodes for the laser diodes. A further path having a reservoir capacitor and a switch to select this further path are implemented for each laser diode. Switch S2 can select the channel having LD1, switch S7 can select the channel having LD2. Isolation or selection of different diodes occurs at the supply node, by making sure that the reservoir capacitors for the channels not selected to fire have zero voltage. By providing different reservoir capacitors for the different diodes, different voltages (provided by having different sizes of reservoir capacitors being charged to a desired voltage) can be used for firing the laser diodes. Each channel has a corresponding pre-charge path, a corresponding fire path, and a corresponding capacitor charge path. Switches are opened or closed depending on the path to be implemented at a given time. Keeping one or more switches open in a particular path can ensure no current flows through that particular path, or can ensure that a particular channel is turned off. An exemplary pre-charge path for diode LD1 is illustrated by the path of one arrow labeled "pre-charge path". An exemplary fire path for diode LD1 is illustrated by the path of another arrow labeled "fire path". An exemplary capacitor charge path for diode LD1 is illustrated by illustrated by the path of another arrow labeled "capacitor charge path", having reservoir capacitor labeled VCC_1. A set of pre-charge path, fire path, and capacitor charge path, is replicated/provided for the rest of the laser diodes respectively. To avoid cluttering up the FIGURE, inductances, while are present in the circuit, are omitted from the FIGURE. One or more switches dedicated to each laser diode can be used to charge the corresponding capacitor. For instance, switch S2 is closed to complete the capacitor charge path, and allow the capacitor VCC_1 to charge to a particular supply voltage. To use the capacitor charge path, switch S2 is closed to connect the reservoir capacitor VCC_1 to the laser supply. After the reservoir capacitor VCC_1 is charged to the particular supply voltage, switch S2 is opened. One or more switches dedicated to each laser diode or channel can be used to select and utilize a given pre-charge path. Having switch S3 closed can complete the pre-charge path for diode LD1. One or more switches can be used to select and fire a corresponding laser diode. For instance, having switch S1 closed can complete the fire path for diode LD1. In this example, switch S1 is shared among the channels, and closing switch S1 can also complete the fire paths for other diodes/channels. By ensuring that the reservoir capacitors for the other channels are at zero voltage (i.e., not charging those reservoir capacitors), the diodes in other channels remain off while one channel is selected to fire. To use the pre-charge path, switch S3 is closed while switch S1 in series with diode LD1 is open and switch S2 is open as well. Switch S1 is closed to complete the fire path (but no current will flow through the fire path at this point). To change from flowing current through the pre-charge path to the fire path, switch S3 is opened (switch S1 remains closed and switch S2 remains open) to allow the current to flow through the fire path. FIG. 15 shows a timing diagram for the circuit shown in FIG. 14.

Figure 16:
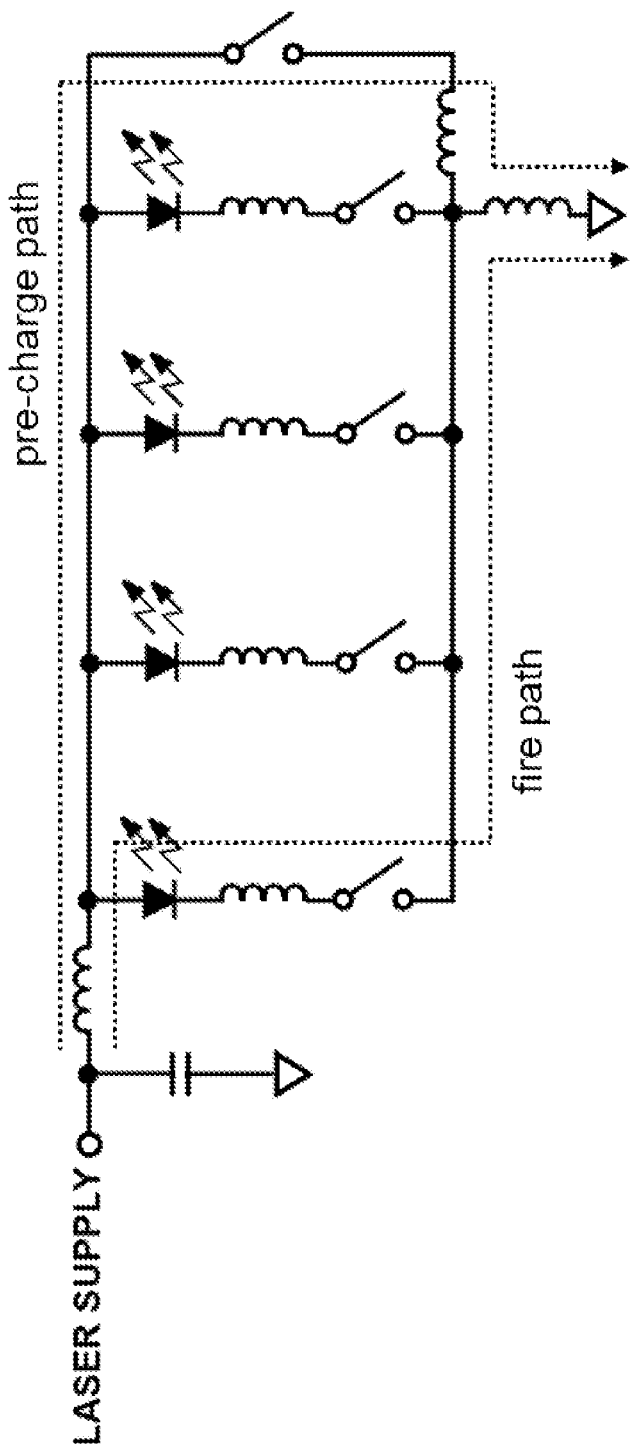
FIG. 16 shows another driver circuit for driving multiple diodes, according to some embodiments of the disclosure.

FIG. 16 shows another driver circuit for driving multiple diodes. Rather than driving laser diodes having a common cathode configuration, this circuit drives laser diodes having a common anode configuration. The principle operation for quickly firing a selected diode is the same, even when the laser diodes have a common anode configuration. An exemplary pre-charge path is illustrated by the path of one arrow labeled "pre-charge path". An exemplary fire path for one of the laser diodes is illustrated by the path of another arrow labeled "fire path". Switches are opened or closed depending on the path to be implemented at a given time. Various schemes for driving laser diodes disclosed herein, besides the scheme illustrated by FIG. 16 (which has a shared pre-charge path) can be adapted readily to circuits where the laser diodes have a common anode configuration. Circuits shown herein having a common cathode configuration can be converted to common anode equivalents, as illustrated by example shown in FIG. 16.

Generally speaking, the embodiments disclosed herein are applicable to optical systems where a fast di/dt is needed to pulse a diode. As previously mentioned, these optical systems include LIDAR, time-of-flight, range finding systems. Optical systems designed for determining depth, distance, and/or speed can also be found in many other systems, including sports electronics, consumer electronics, medical equipment, aerospace/military equipment, automotive electronics, security systems, etc.

In the discussions of the embodiments herein, electrical components such as capacitors, inductors, resistors, switches, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

While the disclosure describe the implementations using NMOS transistors (n-type metal-oxide semiconductor transistor(s)) devices, it is envisioned that complementary configurations using PMOS transistor(s) (p-type metal-oxide semiconductor transistor(s)) or equivalent bipolar-junction transistors (BJTs) can also be replace one or more of the NMOS transistor (or transistor devices) to provide the disclosed switches. It is understood by one skilled in the art that a transistor device can be generalized as a device having three (main) terminals. Furthermore, it is understood by one skilled in the art that a transistor device, during operation, can have a characteristic behavior of transistors corresponding to devices such as NMOS, PMOS, NPN BJT, PNP BJT devices (and any other equivalent transistor devices). Varied implementations are equivalent to the disclosed implementations using NMOS transistors devices because the varied implementations would perform substantially the same function in substantially the same way to yield substantially the same result.

It is also imperative to note that all of the specifications, dimensions, and relationships outlined herein (e.g., circuit components) have only been offered for purposes of example and teaching only. Such information may be varied considerably without departing from the spirit of the present disclosure, or the scope of the appended claims (if any) and/or examples. The specifications apply only to one non-limiting example and, accordingly, they should be construed as such. In the foregoing description, example embodiments have been described with reference to particular component arrangements. Various modifications and changes may be made to such embodiments without departing from the scope of the appended claims (if any) and/or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to pulsing a (laser diode), illustrate only some of the possible functions that may be carried out by the circuits illustrated in the FIGURES. Some of these operations may be deleted or removed where appropriate, or these operations may be modified or changed considerably without departing from the scope of the present disclosure. In addition, the timing of these operations may be altered considerably. The operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) and/or examples. Note that all optional features of the apparatus described herein may also be implemented with respect to the method or process described herein and specifics in the examples may be used anywhere in one or more embodiments.

EXAMPLES

Example A is a method for pulsing a (laser) diode, the method comprising: charging a capacitor to accumulate pulse charge during a first interval; closing a first switch to conduct current through one or more inductive elements and the first switch during a second interval; closing a second switch in series with the diode during a third interval; opening the first switch during a fourth interval to flow current through the diode and the second switch during a fourth interval; and opening the second switch during a fifth interval.

Example X is a circuit for pulsing a (laser) diode therein, the circuit comprising: a first circuit path comprising one or more inductive elements and a first switch; a second circuit path comprising the diode and a second switch; a capacitor for accumulating pulse charge; wherein predefined states of the first switch and the second switch during different intervals pre-charges energy or current in the one or more inductive elements using the pulse charge through the first circuit path prior to flowing the energy or current through the second circuit path to pulse the diode.

Example Y includes Example X and a switch timing controller for controlling the first switch and the second switch.

Other examples include method and circuit for pulsing multiple laser diodes, which may have a common cathode or common anode configuration.

Example 1 is a diode driver circuit, comprising: a first circuit path comprising one or more inductive elements and one or more first switches, a second circuit path comprising the diode and one or more second switches, a capacitor for accumulating pulse charge, wherein predefined states of the first switch and the second switch during different intervals pre-charges current in the one or more inductive elements using the pulse charge through the first circuit path prior to flowing the current through the second circuit path to pulse the diode.

In Example 2, the Example 1 can further include a switch timing controller for generating control signals to the one or more first switches and the one or more second switches to implement the predefined states of the one or more first switch and the one or more second switch during different intervals.

In Example 3, the Example 1 or 2 can further include a third switch to select the capacitor from a plurality of capacitors corresponding to the diode and one or more further diodes for charging the selected capacitor to a predetermined supply voltage for the diode.

In Example 4, any one of the Examples 1-3 can further include a third circuit path in parallel with the second circuit path having a further diode and one or more third switches, wherein predefined states of the one or more second switches and the one or more third switches selects one of the second circuit path and the third circuit path to flow the current.

In Example 5, the Example 4 can further include the diode and the further diode being connected at the cathode or the diode and the further diode being connected at the anode.

In Example 6, any one of the Examples 1-5 can further include at least part of the first circuit path and at least part of the second circuit path being parallel to each other. In some aspects, the "pre-charge path" provides a parallel circuit path to the diode. Current can flow through this parallel circuit path in order to pre-charge at least some of the inductances present in the fire path for firing the diode while current is not flowing through the diode.

In Example 7, any one of the Examples 1-6 can further include the one or more inductive elements being in both the first circuit path and the second circuit path.

In Example 8, any one of the Examples 1-7 can further include the one or more inductive elements including bondwire inductance.

Figure 17:
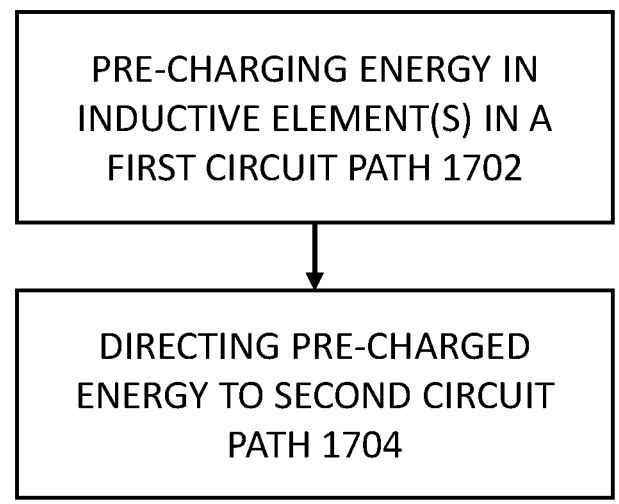
FIG. 17 illustrates exemplary method for pulsing a diode, according to some embodiments of the disclosure.

Example 9 is an apparatus for pulsing a diode, comprising: means for pre-charging energy in one or more inductive elements in a first circuit path (corresponding to step 1702 of FIG. 17); and means for directing the pre-charged energy to a second circuit path having the diode to pulse the diode (corresponding to step 1704 of FIG. 17).

In Example 10, the Example 9 can further include means for directing the pre-charged energy comprising means for completing the second circuit path and subsequently opening the first circuit path.

In Example 11, the Example 8 or 9 can further include means for pre-charging the energy in one or more inductive elements comprising means for conducting current through a first circuit path.

In Example 12, any one of the Examples 8-11 can further include means for directing the pre-charged energy comprising means for selecting the second circuit path from a plurality of second circuit paths having the diode and one or more further diode respectively to pulse only the diode and not the one or more further diodes, and wherein the diode and one or more further diodes are in a common cathode or anode configuration.

The means for such apparatuses in Examples 9-12 can include circuitry illustrated by the FIGURES, to implement the method illustrated by FIG. 17.

What is claimed is:
1. A driver circuit to generate narrow current pulses for driving a laser diode that emits short light pulses and to overcome parasitic inductances of in-package bondwires connecting circuit components between different substrates, comprising:

a capacitor to accumulate pulse charge;
a pre-charge circuit path comprising a first parasitic inductance of a first in-package bondwire connecting the capacitor provided on a first substrate directly to a first terminal of the laser diode provided on a second substrate, the first terminal of the laser diode, a second parasitic inductance of a second in-package bondwire connecting a first switch on a third substrate directly to the first terminal of the laser diode, and the first switch; and
a fire circuit path comprising the first parasitic inductance of the first in-package bondwire and the first terminal of the laser diode;
wherein the first switch is closed to allow current to flow through the pre-charge circuit path, and to pre-charge the first parasitic inductance and the second parasitic inductance in the pre-charge circuit path, before current is allowed to flow through the laser diode.

2. The driver circuit of claim 1, wherein the pre-charge circuit path further comprises:
a third parasitic inductance of a third in-package bondwire connecting the first switch directly to a second terminal of the laser diode;
wherein the first switch is closed to further pre-charge the third parasitic inductance in the pre-charge circuit path.

3. The driver circuit of claim 1, wherein:
the pre-charge circuit path and the fire circuit path include a second terminal of the laser diode.

4. The driver circuit of claim 1, wherein:
the pre-charge circuit path and the fire circuit path include a second switch.

5. The driver circuit of claim 4, wherein:
the pre-charge circuit path and the fire circuit path include a fourth parasitic inductance of a fourth in-package bondwire connecting the second switch directly to a second terminal of the laser diode.

6. The driver circuit of claim 4, wherein the first switch and the second switch are closed to pre-charge at least first and second parasitic inductances of in-package bondwire in the pre-charge circuit path, and to not allow current to flow through the laser diode in the fire circuit path.

7. The driver circuit of claim 4, wherein the first switch is opened and the second switch is closed to open the pre-charge circuit path and to allow stored energy in parasitic inductances in the pre-charge circuit path to flow through the laser diode in the fire circuit path.

8. The driver circuit of claim 4, wherein the first switch and the second switch are opened to allow the capacitor to accumulate pulse charge.

9. A method to overcome limitations due to parasitic inductances of in-package bondwire connecting circuit components between different substrates and generate narrow current pulses for driving a laser diode that emits narrow light pulses, comprising:
accumulating pulse charge in a capacitor provided on a first substrate; and
pre-charging energy in a first parasitic inductance of a first in-package bondwire, while not flowing current through the laser diode, wherein the first in-package bondwire connects a first switch of a laser diode driver circuit provided on a second substrate directly to a first terminal of the laser diode provided on a third substrate; and
after the pre-charging step, flowing stored energy pre-charged in at least the first parasitic inductance of the first in-package bondwire through the laser diode to emit a light pulse.

10. The method of claim 9, further comprising:
pre-charge energy in a second parasitic inductance of a second in-package bondwire, while not flowing current through the laser diode;
wherein the second in-package bondwire connects the laser diode driver circuit to ground.

11. The method of claim 9, further comprising:
pre-charge energy in a third parasitic inductance of a third in-package bondwire, while not flowing current through the laser diode;
wherein the third in-package bondwire connects the laser diode driver circuit directly to a second terminal of the laser diode.

12. The method of claim 9, further comprising:
pre-charge energy in a fourth parasitic inductance of a fourth in-package bondwire, while not flowing current through the laser diode;
wherein the fourth in-package bondwire connects the capacitor directly to the first terminal of the laser diode.

13. The method of claim 9, wherein the laser diode driver circuit further comprises:
a second switch to connect a second terminal of the laser diode to ground.

14. The method of claim 13, wherein the narrow current pulses, generated to drive the laser diode, have a pulse width between 4 and 25 nanoseconds.

15. The method of claim 13, wherein pre-charging energy in the first parasitic inductance comprises:
closing the first switch before closing the second switch.

16. The method of claim 13, wherein pre-charging energy in the first parasitic inductance comprises:
closing the first switch and the second switch at the same time.

17. A driver circuit provided on a first substrate, said driver circuit to quickly pulse a diode provided on a second substrate, and overcome in-package parasitic inductances of bondwires connecting one or more circuit components on the first substrate to one or more circuit components on the second substrate, comprising:
a first switch to connect a first terminal of the diode to a charging capacitor, wherein the first terminal of the diode is connected to ground;
a second switch to connect a second terminal of the diode to the charging capacitor, wherein the second switch is in series with the diode and parallel to the first switch;
a first bondwire to connect the first switch directly to the first terminal of the diode;
a second bondwire to connect the first terminal of the diode to ground;
a switch timing controller to:
close the first switch to pre-charge current through parasitic inductances of the first and second bondwires but not through the diode; and
subsequently, open the first switch and close the second switch to flow the current through the diode and the second bondwire.

18. The driver circuit of claim 17, further comprising:
a third switch to connect the further diode to the charging capacitor, wherein the third switch is in series with the further diode and parallel to the first switch.

19. The driver circuit of claim 18, wherein the switch timing controller is further to:
close the first switch to pre-charge current through parasitic inductances of the first and second bondwires but not through the further diode; and subsequently, open the first switch and close the third switch to flow the current through the further diode and the second bondwire.

20. The driver circuit of claim 17, wherein the diode and the further diode are connected together in a common cathode configuration.

\* \* \* \* \*